United States Patent [19]

Miura

[11] Patent Number: 5,045,818
[45] Date of Patent: Sep. 3, 1991

[54] PLL FREQUENCY MODULATOR HAVING BIAS VOLTAGE APPLIED TO FILTER CAPACITOR

[75] Inventor: Katsunori Miura, Shijonawate, Japan

[73] Assignee: Sanyo Electric Co., Ltd., Osaka, Japan

[21] Appl. No.: 583,549

[22] Filed: Sep. 17, 1990

[30] Foreign Application Priority Data

Sep. 19, 1989 [JP] Japan ................................. 1-244016

[51] Int. Cl.⁵ ........................ H03C 3/09; H03L 7/093
[52] U.S. Cl. .................................... 332/127; 331/17; 332/135; 455/113; 455/119
[58] Field of Search ............... 332/127, 128, 135, 136; 331/17; 455/76, 113, 119

[56] References Cited

U.S. PATENT DOCUMENTS 4,117,422  9/1978  Hunt ............................. 332/127 X

FOREIGN PATENT DOCUMENTS 59-3709  1/1984  Japan.
63-231769  9/1988  Japan.

Primary Examiner—Siegfried H. Grimm
Attorney, Agent, or Firm—Armstrong, Nikaido, Marmelstein, Kubovcik & Murray

[57] ABSTRACT

A frequency modulation circuit includes a VCO which constitutes a PLL along with a loop filter which is operated by a current source. Such a frequency modulation circuit is formed in monolithic IC. When a power source of the IC is turned-on, a capacitor included in the loop filter is biased by an output voltage of a voltage follower which receives Vcc/2. Since this output voltage rises in the same manner as Vcc, a center frequency of the VCO can be rapidly pulled into a phase-locked state of the PLL. In addition, the frequency modulation circuit is provided with a voltage-to-current conversion circuit which increases a charging current for the capacitor in response to a mute signal generated when the power source is turned-on, whereby the time constant of the loop filter is decreased substantially.

9 Claims, 5 Drawing Sheets

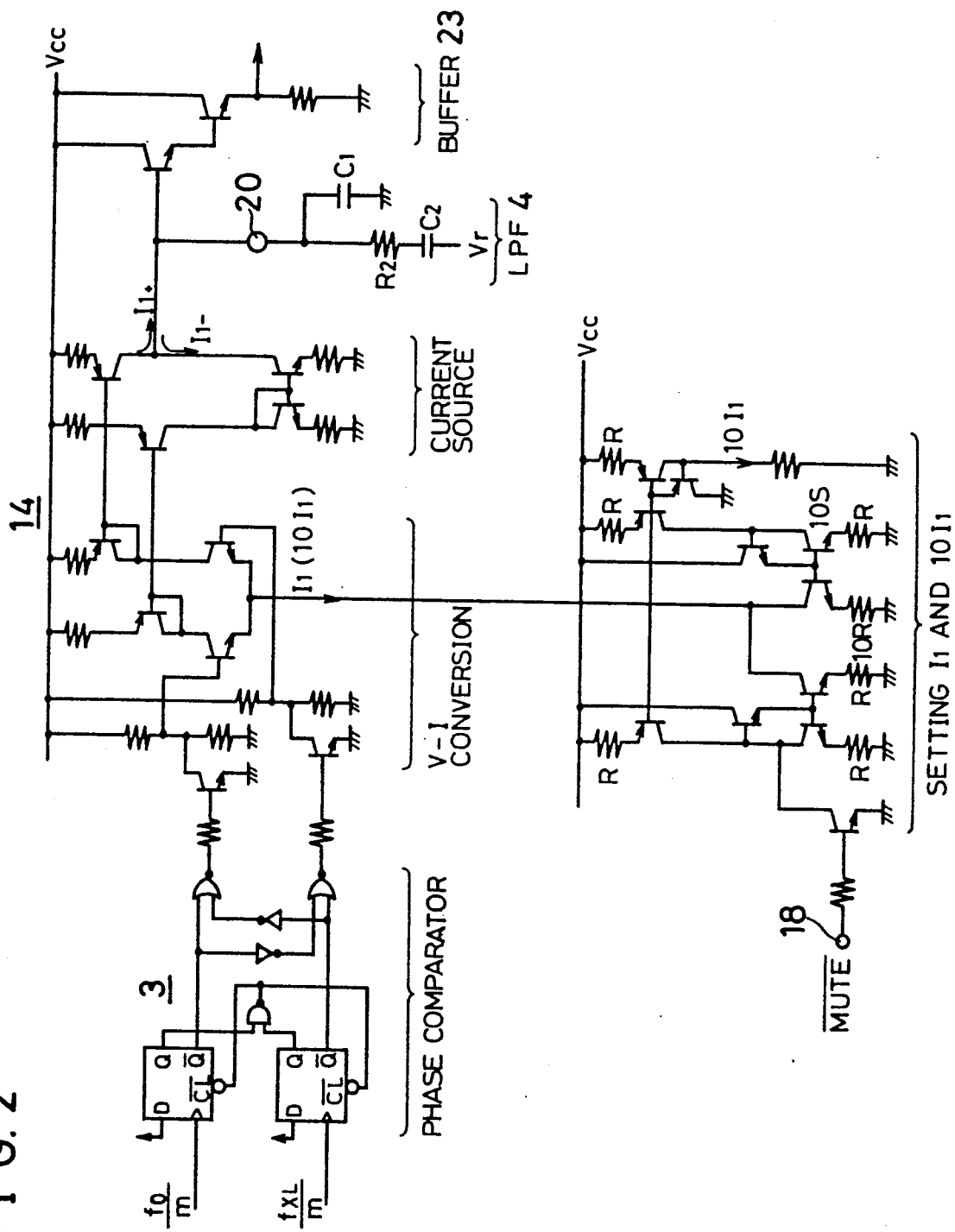
F I G. 2

F I G. 3
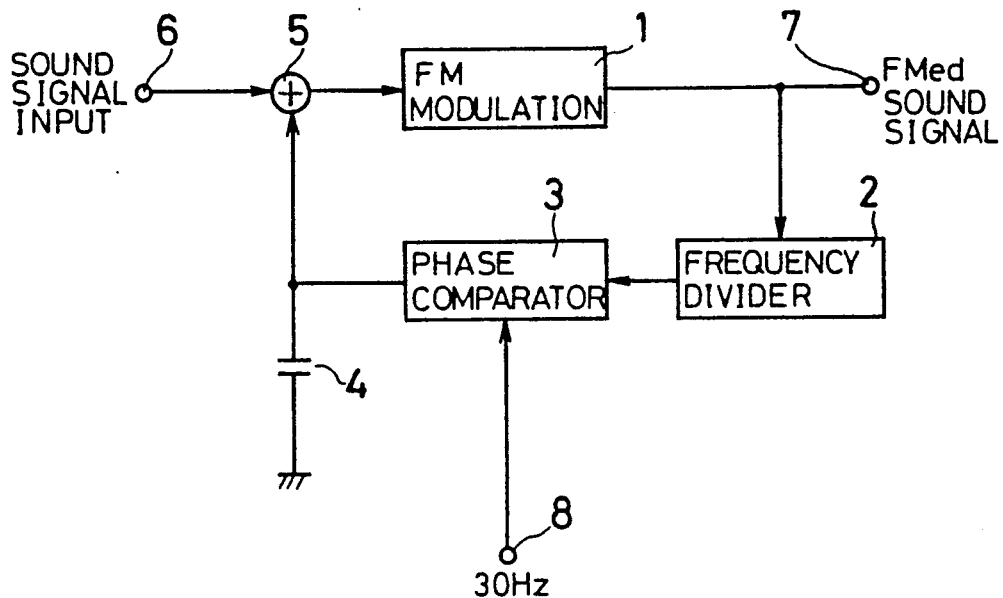
F I G. 4
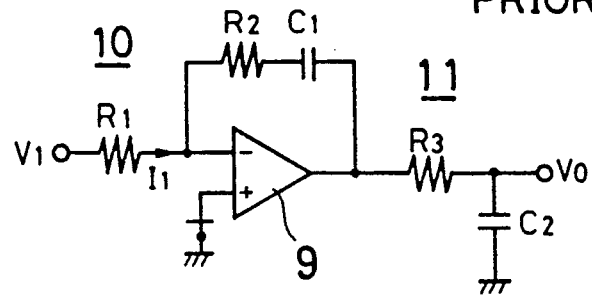
F I G. 5
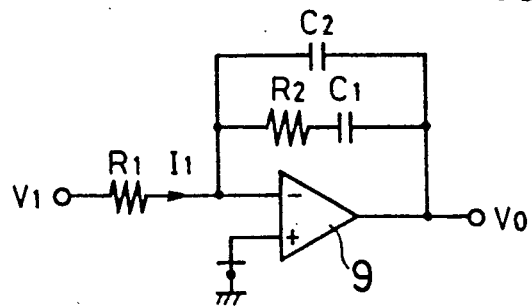

F I G. 8
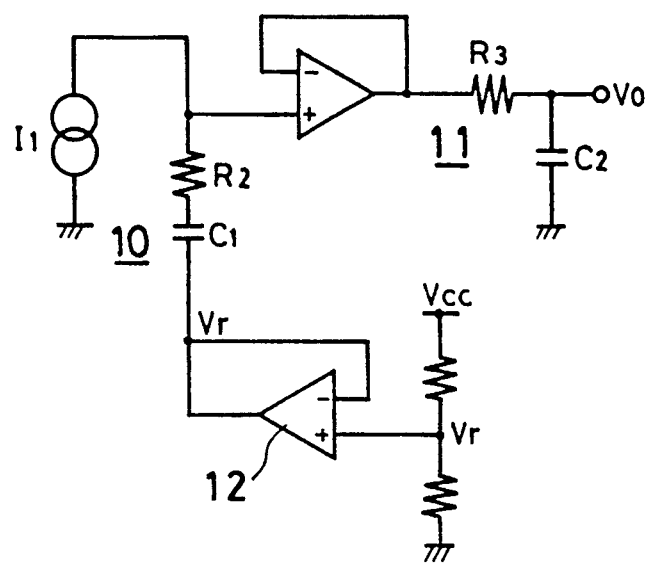

PLL FREQUENCY MODULATOR HAVING BIAS VOLTAGE APPLIED TO FILTER CAPACITOR

BACKGROUND OF THE INVENTION

1. Field of the Invention

The present invention relates to a frequency modulation circuit. More specifically, the present invention relates to a stabilizing circuit for stabilizing a center frequency of a VCO (voltage-controlled oscillator) circuit which is included in a PLL (Phase-Locked Loop) constituting a frequency modulation circuit for frequency-modulating a sound signal, for example.

2. Description of the Prior Arts

For example, in Japanese Patent Laying-open No. 59-3709 (GllB 5/04), as shown in FIG. 3, there is disclosed a configuration wherein an output of a frequency modulation circuit 1 which is constructed by a VCO is frequency-divided to a very low frequency by a frequency divider 2 to be phase-compared with a reference signal of 30 Hz in a phase comparator 3, being added to an original sound signal and supplied to the frequency modulation circuit 1. The reference numeral 4 denotes a capacitor of a loop filter which constitutes a PLL along with the frequency modulation circuit 1. A reason why the phase-comparison is performed in a low frequency region is that it is necessary to prevent the control of the center frequency of the frequency modulation circuit from being influenced by a sound signal input. Therefore, it is necessary to sufficiently lower a cut-off frequency of the loop filter.

A circuit configuration of a specific loop filter which can be utilized in the PLL circuit is shown in FIG. 4. A loop filter shown in FIG. 4 is mainly constructed by an operational amplifier 9, and a front stage 10 determines the step-responsiveness of the PLL circuit and a rear stage 11 determines the stability of the filter in a steady state. Using symbols in FIG. 4, a characteristic of the loop filter can be represented as follows:

$$Vo(S) = \frac{-1}{R_1}\left(R_2 + \frac{1}{SC_1}\right)\left(\frac{1}{1+SC_2R_3}\right)Vi(S) \quad (1)$$

$$= -Ii(S)\left(R_2 + \frac{1}{SC_1}\right)\left(\frac{1}{1+SC_2R_3}\right)$$

However, if such a circuit configuration is adopted in an integrated circuit, since a capacitance of the capacitor is large in a case of a frequency modulation circuit which processes a sound signal, it is necessary to connect the capacitor externally, and therefore, there is a disadvantage that the number of necessary pins (terminals) of the integrated circuit becomes large.

A circuit configuration of FIG. 5 is for solving the above described disadvantage, and the same can reduce the number of necessary pins and perform the same or similar characteristic as that of FIG. 4. A characteristic of the circuit is as follows:

$$Vo(S) = -\frac{1}{R_1}\left(R_2 + \frac{1}{SC_1}\right)\left(\frac{\frac{1}{SC_2}}{R_2 + \frac{1}{SC_1} + \frac{1}{SC_2}}\right)Vi(S) \quad (2)$$

$$= -Ii(S)\left(R_2 + \frac{1}{SC_1}\right)\left(\frac{1}{1+SC_2\left(\frac{n}{1+n}\right)R_2}\right)\left(\frac{1}{1+n}\right)$$

where $C_1 = nC_2$.

In this case, the freedom of a circuit design, for example, the relationship between $C_1$ and $C_2$ is limited; however, the same characteristic as that of FIG. 4 can be obtained.

However, in practice, a characteristic in a high-frequency region of the operational amplifier 9 is different from an ideal state thereof, and therefore, in FIG. 5 circuit configuration, the operational amplifier becomes to function as a merely bypass capacitor with respect to high-frequency components, for example, an edge portion of a phase-comparing signal.

On the other hand, as a kind of a loop filter capable of implementing a similar characteristic, a lowpass filter which is operated by a current source is known. One example is shown in FIG. 6. Using symbols in FIG. 6, characteristic can be represented as follows:

$$Vo(S) = Ii(S)\left(R_2 + \frac{1}{SC_1}\right)\left(\frac{1}{1+SC_2R_3}\right) \quad (3)$$

The circuit of FIG. 6 is similar to the circuit of FIG. 4. Practically, the operational amplifier 9 may be not used and a circuit configuration of FIG. 7 is enough to operate as a loop filter. In a case of FIG. 7 circuit configuration, a characteristic can be represented as follows:

$$Vo(S) = \quad (4)$$

$$Ii(S)\left(R_2 + \frac{1}{SC_1}\right)\left\{\frac{1}{1+SC_2\left(\frac{n}{1+n}\right)R_2}\right\}\left(\frac{n}{1+n}\right)$$

where $C_1 = nC_2$.

If FIG. 7 circuit configuration is utilized, the number of necessary pins may be small and the above described disadvantage of FIG. 5 can be solved.

A problem in the loop filter which is operated by a current source and shown in FIG. 7 is that since a capacitor $C_1$ is connected to the ground, in a case where a power source is a single power source of a positive polarity, the capacitor $C_1$ is charged through a resistor $R_2$, and it takes a lot of time until a terminal voltage Vb of the capacitor $C_1$ becomes approximately the same as a voltage Va. Therefore, in turning a power source on, a pull-in of the center frequency is delayed.

SUMMARY OF THE INVENTION

Therefore, a principal object of the present invention is to provide a novel frequency modulation circuit.

Another object of the present invention is to provide a frequency modulation circuit which is constructed by a PLL, in which there is provided a stabilizing function for stabilizing a center frequency of a VCO.

Another object of the present invention is to provide a frequency modulation circuit incorporated in an integrated circuit, in which a capacitor in a loop filter being operated by a current source is rapidly charged when a power source of the integrated circuit is turned-on, whereby a center frequency of a VCO can be rapidly stabilized.

The other object of the present invention is to provide a frequency modulation circuit incorporated in an integrated circuit, in which a time constant of a loop filter being operated by a current source is made small substantially in response to a control signal such as a mute signal which is produced when a power source of the integrated circuit is turned-on.

A frequency modulation circuit in accordance with the present invention comprises: a PLL which includes a frequency variable oscillator having a control input and an output and a loop filter having a capacitor charged by a current from a current source, said PLL further including a phase-comparing circuit which phase-compares a signal associated with an output of the VCO and a reference signal and applies an output thereof to the loop filter, and said control input receiving a modulation and an output of said loop filter; and biasing means for biasing said capacitor with a bias voltage associated with a power source voltage.

At the same time when the power source voltage rises, the capacitor is biased with a predetermined voltage, and therefore, it is possible to pull a PLL into a center frequency rapidly.

In another aspect of the present invention, a time constant of the loop filter is made small by a control signal, for example, a mute signal, which is outputted for a predetermined time period when the power source is turned-on. In this embodiment, when the power source is turned-on, since the time constant of the loop filter is made small in response to the control signal outputted for a predetermined time period, the responsiveness can be further improved.

In accordance with the present invention, even if a PLL is utilized to make a frequency modulation circuit be adjustment free, it is possible to rapidly stabilize a center frequency at a timing when the power source is turned-on or the like, and therefore, the present invention can be effectively used in a frequency modulation circuit using a VCO.

The objects and other objects, features, aspects and advantages of the present invention will become more apparent from the following detailed description of the embodiments of the present invention when taken in conjunction with accompanying drawings.

BRIEF DESCRIPTION OF THE DRAWINGS

FIG. 2 is a circuit diagram showing a major portion of the embodiment.

FIG. 3 is a block diagram showing a conventional example of a frequency modulation circuit including a PLL.

FIGS. 4 and 5 are circuit diagrams respectively showing prior art loop filters which can be used in FIG. 3.

FIGS. 8 and 9 are circuit diagrams respectively showing circuit configurations of loop filters in accordance with the present invention.

DETAILED DESCRIPTION OF THE EMBODIMENTS

Figure 1:
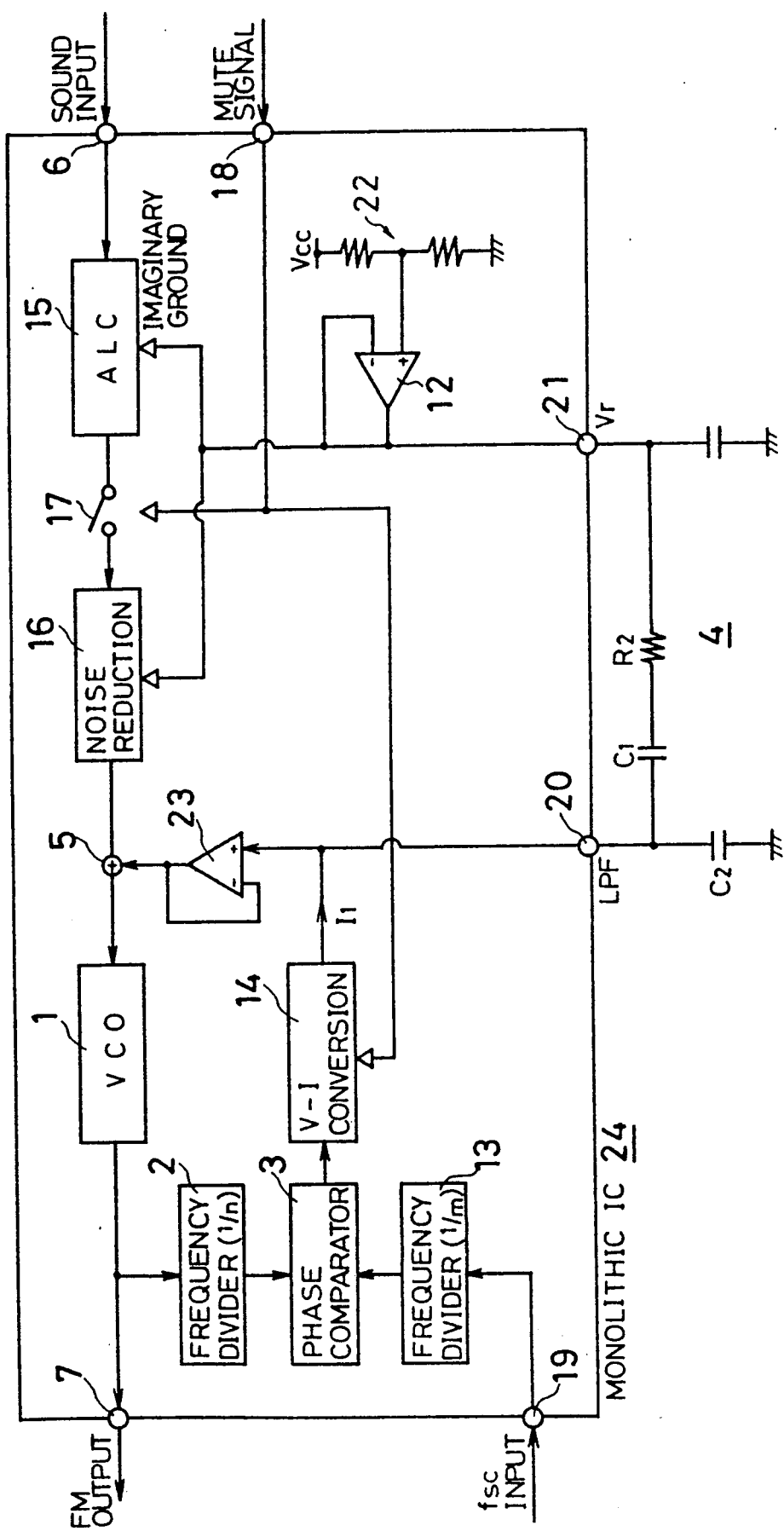
FIG. 1 is a block diagram showing one embodiment in accordance with the present invention.

In the following, embodiments in accordance with the present invention will be described with reference to drawings. FIG. 1 is a block diagram showing one embodiment, FIG. 2 is a circuit diagram showing a portion of the embodiment, FIGS. 8 and 9 are circuit diagrams respectively showing circuit configurations of loop filters, and FIG. 10 is a circuit diagram showing a circuit configuration of another loop filter.

Figure 6:
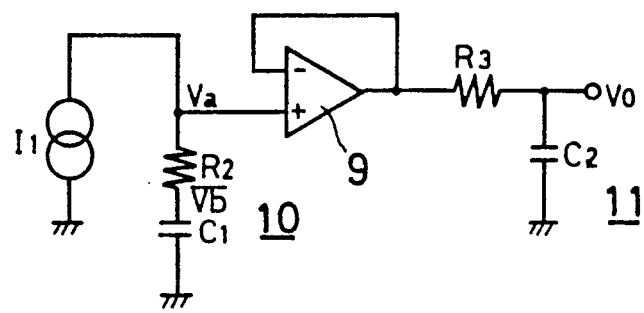
FIGS. 6 and 7 are circuit diagrams respectively showing prior art loop filters each of which is operated by a current source and can be used in FIG. 3.
Figure 7:
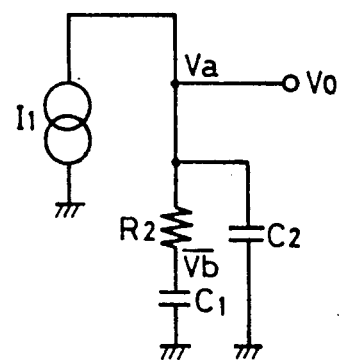
Figure 9:
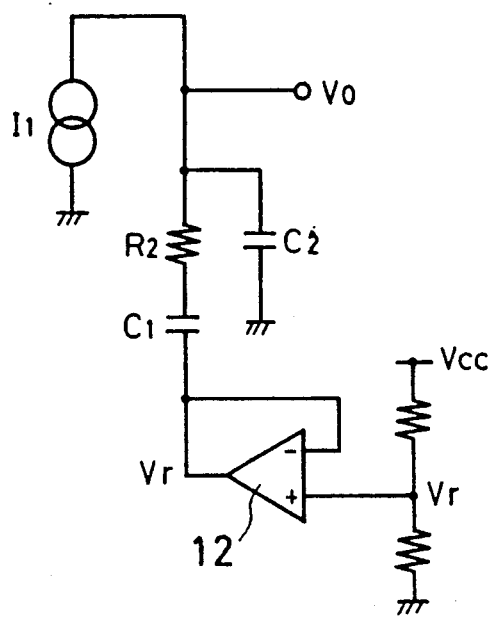
Figure 10:
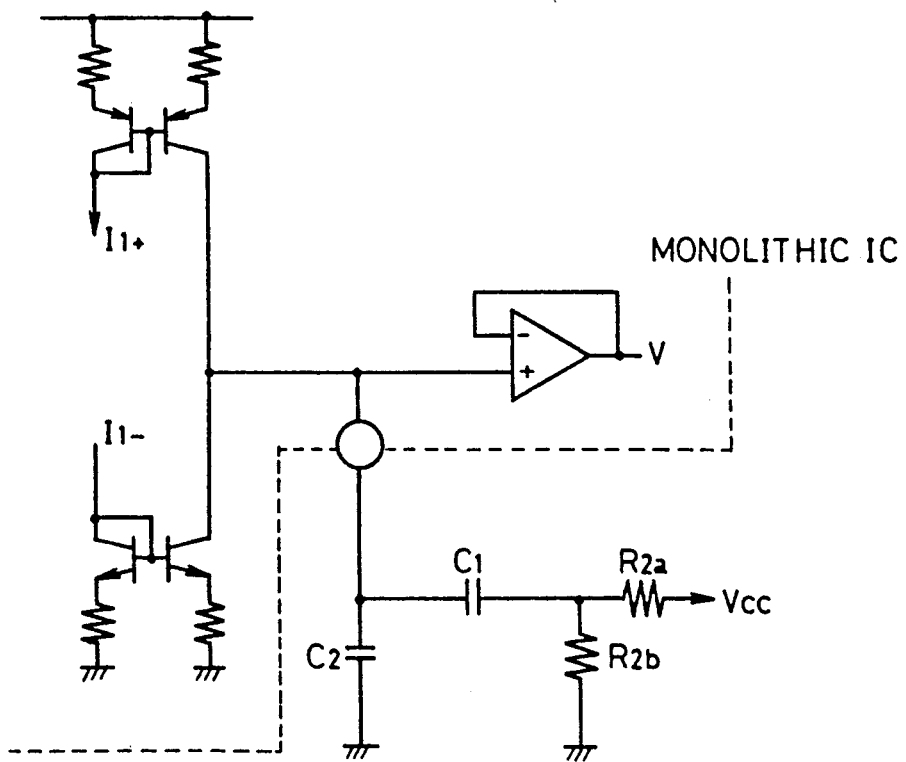
FIG. 10 is a circuit diagram showing another embodiment in accordance with the present invention.

Loop filters of FIGS. 8 and 9 correspond to the loop filters of FIGS. 6 and 7, respectively, and one end of the capacitor $C_1$ which is connected to the ground in the prior arts is connected to an output of a voltage follower 12 including an operational amplifier.

An output voltage Vr of the voltage follower 12 is coincident with a voltage Vr which is a divided voltage of the power source voltage Vcc by means of resistors, and therefore, the same rises when the power source voltage rises. Then, the output of the voltage follower 12 becomes equal to that which is obtained when the same is connected to the ground in an alternating current.

More specifically, since the capacitor $C_1$ of the loop filter is biased by the output of the voltage follower 12 at a timing when the power source is turned-on, it does not take much time to charge the capacitor $C_1$. Therefore, a center frequency of the frequency modulation circuit rapidly becomes a nominal value.

Each of the voltage followers 12 shown in FIGS. 8 and 9 is, in many cases, incorporated in an integrated circuit using a single power source so that an imaginary ground level can be produced. That is, such a voltage follower is formed in an integrated circuit to produce a voltage of Vcc/2.

FIG. 1 shows one embodiment in accordance with the present invention, which is embodied in an integrated circuit comprising such a circuit for producing a reference potential. In FIG. 1, the reference numeral 1 denotes a VCO (voltage-controlled oscillator) which serves as a frequency modulation circuit, the reference numeral 2 denotes a 1/n frequency-divider, the reference numeral 3 denotes a phase comparator, and the reference numeral 4 denotes a loop filter. A PLL is so constructed as to include the VCO 1 and the loop filter 4 including capacitors $C_1$ and $C_2$ and resistor $R_2$.

The the reference numeral 5 denotes an adding circuit, the reference numeral 6 denotes an input terminal for a sound signal, and the reference numeral 7 denotes an output terminal of a frequency-modulated signal.

The reference numeral 12 denotes a voltage follower which serves as a reference voltage source as described above, the reference numeral 13 denotes a 1/m frequency divider, and the reference numeral 14 denotes a V-I (voltage-current) conversion circuit which serves as a current source $I_1$ shown in FIGS. 8 and 9, which charges the capacitor $C_1$ of the loop filter 4.

The reference numeral 15 denotes an ALC circuit which controls a level of an inputted sound signal at constant, the reference numeral 16 denotes a noise reduction (NR) circuit, the reference numeral 17 denotes a switching means for muting the sound signal, the reference numeral 18 denotes an input terminal for a mute signal, the reference numeral 19 denotes an input terminal for a signal fsc (a color sub-carrier frequency signal) which serves as a frequency reference signal, the reference numerals 20 and 21 denote connection terminals for external components of the loop filter 4, and the reference numeral 22 denotes a voltage divider for the voltage follower 12.

In addition, the reference numeral 23 denotes a voltage follower and the reference numeral 24 denotes a monolithic IC which incorporates the above described components 1-3 and 5-23 except for the loop filter 4.

In FIG. 1 embodiment, a sound signal inputted to the terminal 6 is supplied to the VCO 1 through the ALC circuit 15 and NR circuit 16 to control an oscillation frequency of the VCO 1, whereby a frequency modulation is performed. A frequency modulated sound signal is given to the phase comparator 3 after the same is frequency-divided at 1/n in the frequency divider 2. On the other hand, the fsc signal which is an output of a crystal oscillating circuit (not shown) and serves as a frequency reference signal is given to the phase comparator 3 after the same is frequency-divided at 1/m in the frequency divider 13. In addition, a center frequency signal of the VCO 1 which is frequency-divided at 1/n is so set as to become the same frequency as that of the fsc signal which is frequency-divided at 1/m.

An output of the phase comparator 3 is converted into a current value by the V-I conversion circuit 14 to be supplied to the external capacitor $C_1$ and etc. through the terminal 20 so that only very low frequency components which exist outside the frequency band of the sound signal are passed to the adding circuit 5 through the voltage follower 23. That is, a variation, not influenced by the inputted sound signal, of the oscillation frequency of the VCO 1, which may be a variation of the center frequency, is so controlled as to be stabilized at a predetermined value by a PLL operation according to the phase comparison with the reference signal, whereby no adjustment is required.

Meanwhile, in the above described circuit, since an objective signal to be processed is a sound signal, in order to prevent the PLL operation from being influenced by the sound signal, as described above, a time constant of the loop filter is made very large. Therefore, at a timing when the power source of an integrated circuit 24 is turned-on, a voltage which determines a center frequency of the VCO 1 is zero volt. in FIG. 6 circuit configuration, and therefore, it takes a long time until the voltage rises up to a predetermined voltage. That is, it takes a lot of time until the center frequency of the frequency modulation circuit 1, i.e. a frequency which is not frequency-modulated becomes a correct value.

In order to prevent such a problem, in FIG. 1 circuit configuration, the reference voltage $Vr(=Vcc/2)$ is supplied to the external capacitor $C_1$. The voltage Vr rises in the same manner as that of the power source voltage Vcc, and therefore, when the power source voltage Vcc reaches the steady state, the voltage Vr becomes a value of Vcc/2. Therefore, in turning the power source on, the voltage of Vcc/2 is rapidly given to the capacitor $C_1$ to be utilized as a voltage for controlling a center frequency of the VCO 1. Accordingly, the voltage of the terminal 20 rises in the same way as the rising of the power source voltage, and therefore, the oscillation frequency can be rapidly controlled to a nominal center frequency.

In addition, in the PLL circuit or the like, normally, a voltage applied to the VCO in a phase-locked state is set as Vcc/2, and therefore, the voltage of the terminal 20 in a state where the circuit is actually operated is a value nearly equal to Vcc/2. Therefore, by setting the voltage Vr at Vcc/2 in a steady state, that is, by setting the voltage for biasing the capacitor $C_1$ of the loop filter at a control voltage of a phase-locked state of the PLL, the center frequency of the VCO 1 can be rapidly set.

In addition, the voltage Vr is also supplied to the ALC circuit 15 and the NR circuit 16.

Furthermore, in FIG. 1 circuit configuration, the pull-in of the center frequency can be made rapidly by using the mute signal. More specifically, in response to the mute signal which controls the switching means 17, a time constant of the loop filter 4 is made small substantially. To that end, the mute signal is supplied to the current source 14 to make an output current ($I_1$ or $-I_1$) of the current source larger than that of the steady state, so that the time required to charge or discharge is shortened. This point is explained in more detail with reference to FIG. 2.

In FIG. 2, the same reference symbols are applied to the same or similar components of FIG. 1, and therefore, a description will be omitted here. In addition, since respective components are well known in an integrated circuit, a description thereof will be also omitted. When the mute signal is in an active state (the low level), an emitter current of a differential pair provided at a front stage of the V-I conversion circuit 14 is set so as to become a value of approximately ten times an emitter current in a state where no muting operation is performed ($10I_1$). Therefore, a current amount flowing out from the terminal 20 or flowing into the terminal 20 in the muting period becomes approximately ten times a current amount in the steady state. Accordingly, the time required to charge or discharge the capacitor which is connected to the terminal 20 is shortened, and thus, the time constant of the loop filter 4 is equivalently made small.

The mute signal is a signal which is produced when the power source is turned-on or when an operation mode is changed from a play mode to a stop mode. When the mute signal is in an active state, the switching means 17 is turned-off in FIG. 1 circuit. The mute signal produced in turning the power source on is generated so that the same is the low level for a predetermined time period in response to the turning-on of the power source.

When no reference voltage source is provided in an integrated circuit, it is possible to utilize a circuit configuration shown in FIG. 10. In FIG. 10 circuit configuration, the power source voltage Vcc is utilized for a bias voltage for biasing the capacitor $C_1$ of the loop filter 4. More specifically, a voltage divided by the resistors $R_{2a}$ and $R_{2b}$ becomes the bias voltage. In addition, since the power source and the ground have the same level in an alternating current, a resistance value of a parallel circuit of the resistors $R_{2a}$ and $R_{2b}$ must be set to be equal to a resistance value $R_2$.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A frequency modulation circuit, comprising:
    a phase locked loop (PLL) which includes a frequency variable oscillator (VCO) having a control input and an output and a loop filter having a capacitor which is charged by a current from a current source, said PLL further including a phase-comparing circuit which phase-compares a signal associated with an output of said VCO with a reference signal and applies an output thereof to said loop filter, and said control input receiving a modulation signal and an output of said loop filter, so that said VCO outputs a signal frequency-modulated by said modulation signal; and
    biasing means for biasing said capacitor with a bias voltage when a power source is turned-on.

2. A frequency modulation circuit in accordance with claim 1, wherein said PLL and said biasing means are constructed as a monolithic IC and said capacitor is connected to said monolithic IC through a terminal.

3. A frequency modulation circuit in accordance with claim 2, wherein said biasing means includes bias voltage producing means for generating said bias voltage in association with a power source voltage of said monolithic IC.

4. A frequency modulation circuit in accordance with claim 3, wherein said bias voltage producing means includes a voltage-dividing circuit which divides said power source voltage.

5. A frequency modulation circuit in accordance with claim 3, wherein said bias voltage producing means includes a voltage-dividing circuit which divides said power source voltage and a voltage follower which receives an output of said voltage-dividing circuit.

6. A frequency modulation circuit in accordance with claim 1, wherein said loop filter has a predetermined time constant in a steady state thereof, and further comprising lowering means for substantially lowering said time constant of said loop filter in response to a control signal.

7. A frequency modulation circuit in accordance with claim 6, wherein said lowering means includes increasing means for increasing a current by which said capacitor of said loop filter is charged.

8. A frequency modulation circuit in accordance with claim 7, wherein said increasing means includes a differential transistor pair having a current which is controlled in response to said control signal.

9. A frequency modulation circuit in accordance with claim 7, wherein said modulation signal is a sound signal, and further comprising muting means for muting said sound signal in response to said control signal.

* * * * *